US009712126B2

(12) United States Patent
Price et al.

(10) Patent No.: US 9,712,126 B2
(45) Date of Patent: Jul. 18, 2017

(54) AUTOMATICALLY CALIBRATING OPERATIONAL AMPLIFIER (OP-AMP) SYSTEMS FOR MITIGATING EFFECTS OF OFFSET VOLTAGES

(71) Applicant: QUALCOMM Incorporated, San Diego, CA (US)

(72) Inventors: Burt Lee Price, Apex, NC (US); Yeshwant Nagaraj Kolla, Wake Forest, NC (US); Dhaval Rajeshbhai Shah, Raleigh, NC (US); Ajay Janardanan, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/085,122

(22) Filed: Mar. 30, 2016

(65) Prior Publication Data

US 2017/0047903 A1 Feb. 16, 2017

Related U.S. Application Data

(60) Provisional application No. 62/205,510, filed on Aug. 14, 2015.

(51) Int. Cl.
*H03F 3/45* (2006.01)
(52) U.S. Cl.
CPC ..... *H03F 3/45071* (2013.01); *H03F 3/45973* (2013.01); *H03F 2200/153* (2013.01); *H03F 2200/78* (2013.01); *H03F 2203/45048* (2013.01)

(58) Field of Classification Search
CPC ....................................................... H03F 3/45
(Continued)

(56) References Cited

U.S. PATENT DOCUMENTS 6,191,715 B1 2/2001 Fowers
6,724,248 B2 4/2004 Llewellyn
(Continued)

FOREIGN PATENT DOCUMENTS

EP 2221974 A2 8/2010

OTHER PUBLICATIONS

International Search Report and Written Opinion for PCT/US2016/042006, mailed Oct. 4, 2016, 13 pages.
(Continued)

*Primary Examiner* — Henry Choe
(74) *Attorney, Agent, or Firm* — Peter Michael Kamarchik; Kenneth Vu

(57) ABSTRACT

Automatically calibrating operational amplifier (op-amp) systems for mitigating effects of offset voltages are disclosed. In one aspect, an automatically calibrating op-amp system is provided that employs an analog calibration signal corresponding to a calibration mode to compensate an output voltage signal of an op-amp corresponding to an amplify mode. An automatic calibration circuit is included that employs a successive approximation register (SAR) controller configured to successively generate digital values based on the output voltage signal of the op-amp in response to a mode signal indicating the calibration mode. The automatic calibration circuit includes a digital-to-analog converter (DAC) configured to convert each successive digital value into the analog calibration signal in response to the mode signal indicating the calibration mode. The analog calibration signal is provided to an auxiliary differential input of the op-amp to compensate for the composite offset voltage in the amplify mode.

30 Claims, 7 Drawing Sheets

(58) Field of Classification Search
USPC .................................................... 330/259, 9
See application file for complete search history.

(56) References Cited

U.S. PATENT DOCUMENTS

| | | |
|---|---|---|
| 7,265,611 B2 | 9/2007 | Wang |
| 7,321,259 B1* | 1/2008 | Shumarayev ....... H03F 3/45183 327/307 |
| 7,573,334 B2* | 8/2009 | Tantawy ................. G05F 3/205 330/261 |
| 8,854,134 B2* | 10/2014 | Sbuell ................... H03F 3/3044 330/255 |

OTHER PUBLICATIONS

Enz, Christian C. et al., "Circuit Techniques for Reducing the Effects of Op-Amp Imperfections: Autozeroing, Correlated Double Sampling, and Chopper Stabilization," Proceedings of the IEEE, vol. 84, No. 11, Nov. 1996, pp. 1584-1614.

Reyes, Benjamin T. et al., "A 6-bit 2GS/s CMOS Time-Interleaved ADC for Analysis of Mixed-Signal Calibration Techniques," 2014 IEEE 5th Latin American Symposium on Circuits and Systems (LASCAS), IEEE, Feb. 25-28, 2014, Santiago, Chile, 4 pages.

* cited by examiner

| CALIBRATION CYCLE | BIT SIGNAL (108(7)-108(0)) | CAL.V_OFFSET |
|---|---|---|
| CYCLE 1 | 10000000 | 50 mV > 40 mV |
| CYCLE 2 | 01000000 | 25 mV < 40 mV |
| CYCLE 3 | 01100000 | 37.5 mV < 40 mV |
| CYCLE 4 | 01110000 | 43.75 mV > 40 mV |
| CYCLE 5 | 01101000 | 40.63 mV > 40 mV |
| CYCLE 6 | 01100100 | 39.06 mV < 40 mV |
| CYCLE 7 | 01100110 | 39.84 mV < 40 mV |
| CYCLE 8 | 01100111 | 40.23 mV > 40 mV |

AUTOMATICALLY CALIBRATING OPERATIONAL AMPLIFIER (OP-AMP) SYSTEMS FOR MITIGATING EFFECTS OF OFFSET VOLTAGES

PRIORITY CLAIM

The present application claims priority under 35 U.S.C. §119(e) to U.S. Provisional Patent Application Ser. No. 62/205,510 filed on Aug. 14, 2015 and entitled "AUTOMATICALLY CALIBRATED OPERATIONAL AMPLIFIER SYSTEMS FOR OFFSET VOLTAGE MITIGATION," the contents of which is incorporated herein by reference in its entirety.

BACKGROUND

I. Field of the Disclosure

The technology of the disclosure relates generally to operational amplifiers, and particularly to calibrating operational amplifiers in light of offset voltages.

II. Background

An operational amplifier (also referred to as an "op-amp") is a device that receives differential input signals and generates an output voltage based on a gain of the op-amp. A wide variety of circuit functions may be accomplished using op-amps, and thus, op-amps are employed in a vast array of electronic devices. However, process variations in the manufacturing of internal components of an op-amp may generate unintended internal offset voltages that change the output voltage. In this manner, the output voltage of an op-amp is calculated by multiplying a gain of the op-amp by a sum of the voltage difference of the differential input signals and any such offset voltage present. For example, an op-amp receiving a first differential input voltage $V_1$ and a second differential input voltage $V_2$, and having an offset voltage $V_{OFFSET}$, generates an output voltage $V_{OUT}$ equal to $A*(V_1-V_2+V_{OFFSET})$, where 'A' represents the op-amp's gain. Thus, the offset voltage $V_{OFFSET}$ may increase or decrease the output voltage $V_{OUT}$ of the op-amp.

Variations in the output voltage $V_{OUT}$ of an op-amp attributable to an offset voltage $V_{OFFSET}$ of the op-amp may delay or cause errors in other elements of a circuit that employ the op-amp. In this manner, an offset voltage $V_{OFFSET}$ of an op-amp may cause reduced performance of circuits designed with a low tolerance for variation in an output voltage $V_{OUT}$ of an op-amp. Therefore, it would be advantageous to employ op-amps such that effects of an offset voltage $V_{OFFSET}$ on an output voltage $V_{OUT}$ of an op-amp are reduced or avoided.

SUMMARY OF THE DISCLOSURE

Aspects disclosed in the detailed description include automatically calibrating operational amplifier (op-amp) systems for mitigating effects of offset voltages. In one aspect, an automatically calibrating op-amp system is provided that employs an analog calibration signal corresponding to a calibration mode to compensate an output voltage signal of an op-amp corresponding to an amplify mode. In this regard, the automatically calibrating op-amp system includes an automatic calibration circuit that employs a successive approximation register (SAR) controller configured to successively generate digital values based on the output voltage signal of the op-amp in response to a mode signal indicating the calibration mode. The automatic calibration circuit also includes a digital-to-analog converter (DAC) configured to convert each successive digital value from the SAR controller into the analog calibration signal in response to the mode signal indicating the calibration mode. The automatic calibration circuit is configured such that when the last of the successive digital values is converted, the analog calibration signal has a voltage approximately equal to a composite offset voltage of the op-amp. The analog calibration signal is provided to an auxiliary differential input of the op-amp such that the analog calibration signal compensates for the composite offset voltage of the op-amp in response to the mode signal indicating the amplify mode. In this manner, because the analog calibration signal is generated having a voltage approximately equal to the composite offset voltage, compensating the op-amp with the analog calibration signal reduces or avoids the effects of the composite offset voltage on the voltage output signal.

In this regard, in one aspect, an automatically calibrating op-amp system is provided. The automatically calibrating op-amp system comprises an op-amp. The op-amp comprises a primary differential input pair, an auxiliary differential input pair, and an output. The op-amp is configured to generate an op-amp output voltage signal on the output based on a voltage differential of the primary differential input pair and a voltage differential of the auxiliary differential input pair. The automatically calibrating op-amp system further comprises an automatic calibration circuit configured to electrically couple the primary differential input pair in response to a mode signal indicating a calibration mode, and electrically decouple the primary differential input pair in response to the mode signal indicating an amplify mode. The automatic calibration circuit comprises a successive approximation register (SAR) controller. The SAR controller is configured to successively generate a plurality of bit signals in response to the mode signal indicating the calibration mode, wherein a value of each successive plurality of bit signals is based on the op-amp output voltage signal. The automatic calibration circuit further comprises a digital-to-analog converter (DAC). The DAC is configured to convert each successive plurality of bit signals into an analog calibration signal based on a reference voltage in response to the mode signal indicating the calibration mode. The DAC is further configured to provide the analog calibration signal to one auxiliary input of the auxiliary differential input pair, wherein another input of the auxiliary differential input pair is configured to be driven by a voltage based on the reference voltage such that the analog calibration signal compensates for a composite offset voltage of the op-amp in response to the mode signal indicating the amplify mode.

In another aspect, an automatically calibrating op-amp system is provided. The automatically calibrating op-amp system comprises a means for generating an op-amp output voltage signal based on a voltage differential of a primary differential input pair and a voltage differential of an auxiliary differential input pair. The automatically calibrating op-amp system further comprises a means for electrically coupling the primary differential input pair in response to a mode signal indicating a calibration mode. The automatically calibrating op-amp system further comprises a means for electrically decoupling the primary differential input pair in response to the mode signal indicating an amplify mode. The automatically calibrating op-amp system further comprises a means for successively generating a plurality of bit signals in response to the mode signal indicating the calibration mode, wherein a value of each successive plurality of bit signals is based on the op-amp output voltage signal. The automatically calibrating op-amp system further comprises a means for converting each successive plurality of bit signals into an analog calibration signal based on a reference voltage in response to the mode signal indicating the calibration mode. The automatically calibrating op-amp system further comprises a means for providing the analog calibration signal to one auxiliary input of the auxiliary differential input pair, wherein another input of the auxiliary differential input pair is configured to be driven by a voltage based on the reference voltage such that the analog calibration signal compensates for a composite offset voltage of the means for generating the op-amp output voltage signal in response to the mode signal indicating the amplify mode.

In another aspect, a method for automatically calibrating an op-amp is provided. The method comprises generating an op-amp output voltage signal of an op-amp based on a voltage differential of a primary differential input pair and a voltage differential of an auxiliary differential input pair. The method further comprises electrically coupling the primary differential input pair in response to a mode signal indicating a calibration mode. The method further comprises electrically decoupling the primary differential input pair in response to the mode signal indicating an amplify mode. The method further comprises successively generating a plurality of bit signals in response to the mode signal indicating the calibration mode, wherein a value of each successive plurality of bit signals is based on the op-amp output voltage signal. The method further comprises converting each successive plurality of bit signals into an analog calibration signal based on a reference voltage in response to the mode signal indicating the calibration mode. The method further comprises providing the analog calibration signal to one auxiliary input of the auxiliary differential input pair to be driven by a voltage based on the reference voltage such that the analog calibration signal compensates for a composite offset voltage of the op-amp in response to the mode signal indicating the amplify mode.

In another aspect, an on-die current measurement system is provided. The on-die current measurement system comprises a voltage source. The voltage source is configured to provide voltage to a source of a head switch transistor. The voltage source is further configured to provide voltage to a source of a mirror transistor. The on-die current measurement system further comprises the head switch transistor configured to provide voltage to a load circuit. The on-die current measurement system further comprises the mirror transistor configured to provide voltage to a source of a cascode transistor. The on-die current measurement system further comprises a drain of the cascode transistor configured to provide voltage to a sense resistor. The on-die current measurement system further comprises the sense resistor configured to provide voltage to an analog-to-digital converter (ADC). The on-die current measurement system further comprises the ADC configured to convert the voltage from the sense resistor into a digital data stream representative of a power supply current of the load circuit. The on-die current measurement system further comprises an automatically calibrating op-amp system. The automatically calibrating op-amp system comprises an op-amp. The op-amp comprises a primary differential input pair, an auxiliary differential input pair, and an output. The op-amp is configured to generate an op-amp output voltage signal on the output based on a voltage differential of the primary differential input pair and a voltage differential of the auxiliary differential input pair. The automatically calibrating op-amp system further comprises an automatic calibration circuit configured to electrically couple the primary differential input pair in response to a mode signal indicating a calibration mode, and electrically decouple the primary differential input pair in response to the mode signal indicating an amplify mode. The automatic calibration circuit comprises a SAR controller. The SAR controller is configured to successively generate a plurality of bit signals in response to the mode signal indicating the calibration mode, wherein a value of each successive plurality of bit signals is based on the op-amp output voltage signal. The automatic calibration circuit further comprises a DAC. The DAC is configured to convert each successive plurality of bit signals into an analog calibration signal based on a reference voltage in response to the mode signal indicating the calibration mode. The DAC is further configured to provide the analog calibration signal to one auxiliary input of the auxiliary differential input pair, wherein another input of the auxiliary differential input pair is configured to be driven by a voltage based on the reference voltage such that the analog calibration signal compensates for a composite offset voltage of the op-amp in response to the mode signal indicating the amplify mode. The op-amp is further configured to receive a first input voltage from a drain of the mirror transistor and a second input voltage from the load circuit in response to the mode signal indicating the amplify mode. The op-amp is further configured to provide the op-amp output voltage signal to a gate of the cascode transistor.

BRIEF DESCRIPTION OF THE FIGURES

FIG. 3 is an exemplary set of bit signals successively generated by a successive approximation register (SAR) controller and an analog calibration signal generated by a digital-to-analog converter (DAC) in the automatically calibrating op-amp system in FIG. 1 in response to a mode signal indicating a calibration mode;

DETAILED DESCRIPTION

Figure 1:
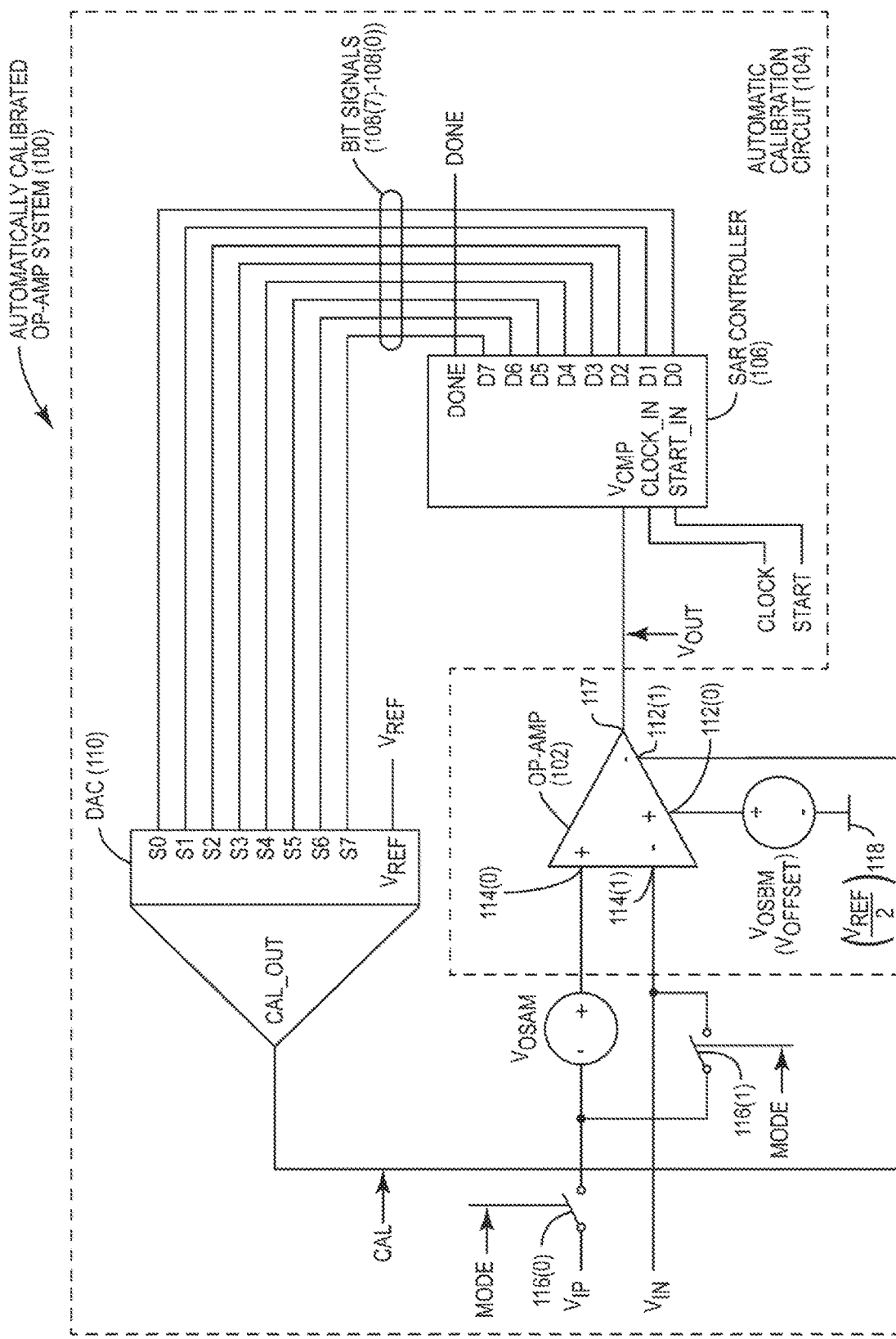
FIG. 1 is a diagram of an exemplary automatically calibrating operational amplifier (op-amp) system for mitigating effects of offset voltages.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

FIG. 1 is illustrates an exemplary automatically calibrating operational amplifier (op-amp) system 100. As discussed in more detail below, the automatically calibrating op-amp system 100 is configured to compensate an op-amp output voltage signal ($V_{OUT}$) generated by an op-amp 102 to mitigate effects of a composite offset voltage ($V_{OFFSET}$) corresponding to the op-amp 102. As used herein, the composite offset voltage ($V_{OFFSET}$) is a value used to reference effects of all offset voltages of the op-amp 102, wherein offset voltages are attributable to imperfections of the op-amp 102. In one aspect, the automatically calibrating op-amp system 100 employs an analog calibration signal (CAL) corresponding to a calibration mode to compensate the op-amp output voltage signal ($V_{OUT}$) corresponding to an amplify mode. In this regard, an automatic calibration circuit 104 includes a successive approximation register (SAR) controller 106 configured to receive the op-amp output voltage signal ($V_{OUT}$). The SAR controller 106 is also configured to successively generate bit signals 108(7)-108(0) based on the op-amp output voltage signal ($V_{OUT}$) in response to a mode signal (MODE) indicating the calibration mode.

With continuing reference to FIG. 1, the automatic calibration circuit 104 also includes a digital-to-analog converter (DAC) 110 configured to convert each successive set of bit signals 108(7)-108(0) from the SAR controller 106 into the analog calibration signal (CAL) in response to the mode signal (MODE) indicating the calibration mode. The automatic calibration circuit 104 is configured such that, when the last set of the successive bit signals 108(7)-108(0) is converted, the analog calibration signal (CAL) has a voltage approximately equal to a composite offset voltage ($V_{OFFSET}$) of the op-amp 102. The analog calibration signal (CAL) is provided to one of an auxiliary differential input pair 112 of the op-amp 102 such that the analog calibration signal (CAL) compensates for the composite offset voltage ($V_{OFFSET}$) of the op-amp 102 in response to the mode signal (MODE) indicating the amplify mode. In this manner, because the analog calibration signal (CAL) is generated having a voltage approximately equal to the composite offset voltage ($V_{OFFSET}$), compensating the op-amp 102 with the analog calibration signal (CAL) reduces or avoids the effects of the composite offset voltage ($V_{OFFSET}$) on the op-amp output voltage signal ($V_{OUT}$).

With continuing reference to FIG. 1, details of the automatically calibrating op-amp system 100 are now described. The automatically calibrating op-amp system 100 is configured such that the op-amp 102 generates the op-amp output voltage signal ($V_{OUT}$). The op-amp output voltage signal ($V_{OUT}$) is based on a voltage differential of a primary differential input pair 114 (also referred to herein as a first primary input 114(0) and a second primary input 114(1)) and a voltage differential of an auxiliary differential input pair 112 (also referred to herein as a first auxiliary input 112(0) and a second auxiliary input 112(1)) of the op-amp 102. In particular, first and second input voltages ($V_{IP}$) and ($V_{IN}$) may be provided to the first and second primary inputs 114(0), 114(1), respectively, while other voltages are may be provided to the first and second auxiliary inputs 112(0), 112(1).

With continuing reference to FIG. 1, the automatic calibration circuit 104 is configured to electrically decouple the first and second primary inputs 114(0), 114(1) in response to the mode signal (MODE) indicating the amplify mode. In this manner, the automatic calibration circuit 104 includes a first switch 116(0) that is activated (i.e., closed) and a second switch 116(1) that is deactivated (i.e., open) in response to the mode signal (MODE) indicating the amplify mode. In response to activation of the first switch 116(0) and deactivation of the second switch 116(1), the first input voltage ($V_{IP}$) is provided to the first primary input 114(0), and the second voltage input ($V_{IN}$) is provided to the second primary input 114(1). Additionally, the analog calibration signal (CAL) is provided to the second auxiliary input 112(1). In this manner, the op-amp 102 is configured to generate the op-amp output voltage signal ($V_{OUT}$) on an output 117 equal to $A*(V_{IP}-V_{IN}+V_{OSAM})+B*(V_{OSBM}-CAL)$. In this equation, A is a gain associated with the first and second primary inputs 114(0), 114(1), and B is a gain associated with the first and second auxiliary inputs 112(0), 112(1). Further, $V_{OSAM}$ represents a primary offset voltage associated with the first and second primary inputs 114(0), 114(1), and $V_{OSBM}$ represents an auxiliary offset voltage associated with the first and second auxiliary inputs 112(0), 112(1).

With continuing reference to FIG. 1, the primary offset voltage ($V_{OSAM}$) and the auxiliary offset voltage ($V_{OSBM}$) are each illustrated as discrete voltage sources for purposes of the discussion herein. However, one of ordinary skill in the art will appreciate that the primary and auxiliary offset voltages ($V_{OSAM}$, $V_{OSBM}$) are associated with the primary differential input pair 114 and the auxiliary differential input pair 112, respectively, rather than existing as discrete voltage sources. Further, as noted above, the composite offset voltage ($V_{OFFSET}$) of the op-amp 102 is attributable to imperfections of the op-amp 102. One way to describe the composite offset voltage ($V_{OFFSET}$) is with reference to the auxiliary differential input pair 112, wherein the composite offset voltage ($V_{OFFSET}$) is equal to $A*V_{OSAM}/B+V_{OSBM}$. By describing the composite offset voltage ($V_{OFFSET}$) with reference to the auxiliary differential input pair 112, the composite offset voltage ($V_{OFFSET}$) can illustrated in FIG. 1 as being present at the same location as the auxiliary offset voltage ($V_{OSBM}$) corresponding to the first auxiliary input 112(0).

To mitigate the effects of the composite offset voltage ($V_{OFFSET}$), the automatic calibration circuit 104 is also configured to operate in the calibration mode. In this regard, the first and second primary inputs 114(0), 114(1) are electrically coupled in response to the mode signal (MODE) indicating the calibration mode. For example, in this aspect, the first switch 116(0) is deactivated (i.e., open) and the second switch 116(1) is activated (i.e., closed) in response to the mode signal (MODE) indicating the calibration mode. Thus, in the calibration mode, the primary offset voltage ($V_{OSAM}$) is applied differentially between the first primary input 114(0) and the second primary input 114(1) due to deactivation of the first switch 116(0) and activation of the second switch 116(1). As a result, the op-amp 102 generates the op-amp output voltage signal ($V_{OUT}$) representing a comparison of a voltage on the first auxiliary input 112(0) and a voltage on the second auxiliary input 112(1). Thus, if the composite offset voltage ($V_{OFFSET}$) is greater than the analog calibration signal (CAL) on the second auxiliary input 112(1), the op-amp output voltage signal ($V_{OUT}$) is equivalent to a logic high '1' state. Conversely, if the composite offset voltage ($V_{OFFSET}$) is less than the analog calibration signal (CAL) on the second auxiliary input 112(1), the op-amp output voltage signal ($V_{OUT}$) is equivalent to a logic low '0' state.

With continuing reference to FIG. 1, the op-amp output voltage signal ($V_{OUT}$) is provided to a voltage compare input ($V_{CMP}$) of the SAR controller 106 that is configured to receive the op-amp output voltage signal ($V_{OUT}$). In response to a start signal (START) on a start input (START_IN), the SAR controller 106 is configured to generate the bit signals 108(7)-108(0) on bit signal outputs D7-D0 in response to the mode signal (MODE) indicating the calibration mode. The bit signal outputs D7-D0 are configured to provide the successive bit signals 108(7)-108(0) to the DAC 110. Additionally, the SAR controller 106 includes a clock input (CLOCK_IN) configured to receive a clock signal (CLOCK), wherein the calibration mode has a duration of N+1 cycles of the clock signal (CLOCK). In this example, N is equal to the number of bits of the SAR controller 106. The SAR controller 106 has eight (8) bits (e.g., bits 7-0) corresponding to the bit signals 108(7)-108(0). Thus, the calibration mode of the automatically calibrating op-amp system 100 has a duration of nine (9) clock cycles. As discussed below, the SAR controller 106 is configured to generate the bit signals 108(7)-108(0) during the first eight (8) cycles of the calibration mode, while a final cycle of the calibration mode is used to generate a done signal (DONE). In other aspects, the number of bits "N" may be any whole number. A voltage source 118 having a voltage of one-half of a reference voltage ($V_{REF}/2$) drives the first auxiliary input 112(0).

With continuing reference to FIG. 1, each of the bit signals 108(7)-108(0) corresponds to a cycle of the calibration mode. The bit signal 108(7)-108(0) corresponding to the current cycle of the calibration mode is set to a logic high '1' at the outset of the cycle. For example, during the first cycle of the calibration mode, the most significant bit of the bit signals 108(7)-108(0) (i.e., bit signal 108(7)) is set to a logic high '1' state, causing the bit signals 108(7)-108(0) to equal 1000000. The bit signals 108(7)-108(0) are provided to bit signal inputs S7-S0 of the DAC 110. In response to receiving the bit signals 108(7)-108(0), the DAC 110 is configured to convert the bit signals 108(7)-108(0) into the analog calibration signal (CAL). The DAC 110 includes a calibration output ($CAL_{OUT}$) configured to provide the analog calibration signal (CAL) to the second auxiliary input 112(1).

As previously described, if the composite offset voltage ($V_{OFFSET}$) associated with the first auxiliary input 112(0) is greater than the analog calibration signal (CAL) on the second auxiliary input 112(1), the op-amp output voltage signal ($V_{OUT}$) is equivalent to a logic high '1' state. In response to the op-amp output voltage signal ($V_{OUT}$) having a logic high '1' state, the corresponding bit signal 108(7)-108(0) remains at a logic high '1' state. Conversely, if the composite offset voltage ($V_{OFFSET}$) associated with the first auxiliary input 112(0) is less than the analog calibration signal (CAL) on the second auxiliary input 112(1), the op-amp output voltage signal ($V_{OUT}$) is equivalent to a logic low '0' state. In response to the op-amp output voltage signal ($V_{OUT}$) having a logic low '0' state, the corresponding bit signal 108(7)-108(0) is set to a logic low '0' state. For example, if the op-amp output voltage signal ($V_{OUT}$) has a logic high '1' state, the most significant bit signal 108(7) remains at a logic high '1' state. In other aspects, the comparison performed by the op-amp 102 can generate the op-amp output voltage signal ($V_{OUT}$) in the metastable region. In such aspects, additional gain stages can be employed to drive the op-amp output voltage signal ($V_{OUT}$) to a stable logic high '1' state or logic low '0' state. As a non-limiting example, additional gain stages can be employed in the SAR controller 106 such that the op-amp output voltage signal ($V_{OUT}$) can trigger corresponding elements in the SAR controller 106.

Further, the op-amp output voltage signal ($V_{OUT}$) is provided to the SAR controller 106 such that a next successive bit signal 108(7)-108(0) is generated based on the op-amp output voltage signal ($V_{OUT}$) and provided to the DAC 110. For example, the next bit signal 108(7)-108(0) is set to a logic high '1' state (e.g., bit signal 108(6) is set to logic high '1,' wherein the bit signal 108(7)-108(0) is set to 11000000 if the comparison of the voltages provided on the first and second auxiliary inputs 112(0), 112(1) set the bit signal 108(7) to a logic high '1' state). The conversion and comparison functions described above are completed for the next cycle of the calibration mode. Thus, following the N+1 cycles of the calibration mode, the analog calibration signal (CAL) has a voltage that is approximately equal to the composite offset voltage ($V_{OFFSET}$). In other words, the composite offset voltage ($V_{OFFSET}$) equals ($A*V_{OSAM}/B+V_{OSBM}$). By comparing the analog calibration signal (CAL) to the composite offset voltage ($V_{OFFSET}$) for each iteration of the SAR controller 106, the analog calibration signal (CAL) following the final cycle of the calibration mode is approximately equal to ($A*V_{OSAM}/B+V_{OSBM}$) (e.g., the composite offset voltage ($V_{OFFSET}$)).

In this manner, as previously described, the op-amp output voltage signal ($V_{OUT}$) equals $A*(V_{IP}-V_{IN}+V_{OSAM})+B*(V_{OSBM}-CAL)$ in response to the mode signal (MODE) indicating the amplify mode. By substituting ($A*V_{OSAM}/B+V_{OSBM}$) for the analog calibration signal (CAL) in the previous equation, the equation reduces down to the op-amp output voltage signal ($V_{OUT}$)=$A(V_{IP}-V_{IN})$. Thus, in response to the mode signal (MODE) indicating the amplify mode, the analog calibration signal (CAL) provided to the second auxiliary input 112(1) compensates for the composite offset voltage ($V_{OFFSET}$). In other words, effects of the composite offset voltage ($V_{OFFSET}$) (i.e., all offset voltages of the op-amp 102) on the op-amp output voltage signal ($V_{OUT}$) are mitigated. Therefore, the automatically calibrating op-amp system 100 reduces or avoids the effects of the composite offset voltage ($V_{OFFSET}$) on the op-amp output voltage signal ($V_{OUT}$) generated by the op-amp 102.

Figure 2:
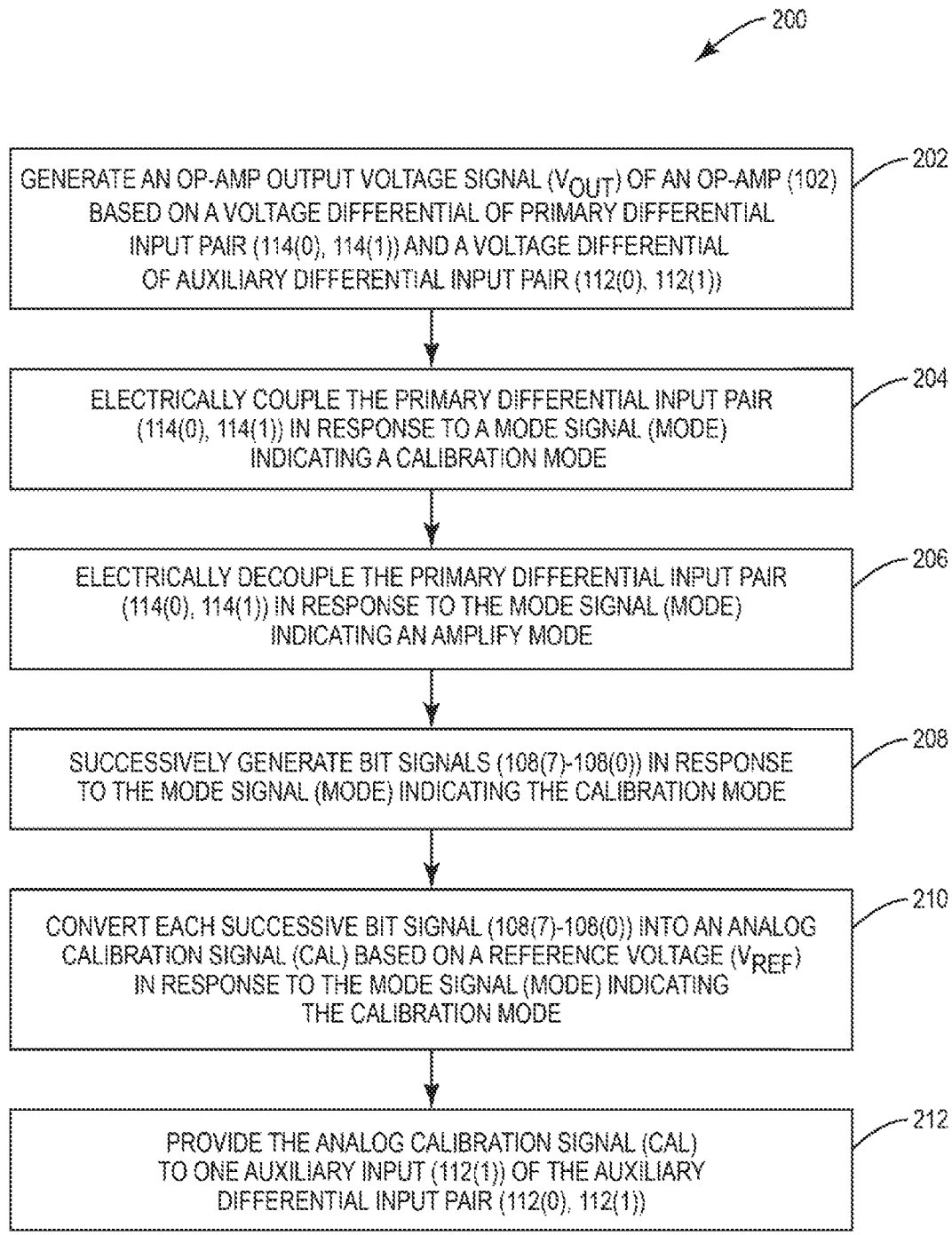
FIG. 2 is a flowchart of an exemplary process for automatically calibrating the op-amp in the automatically calibrating op-amp system in FIG. 1 for mitigating effects of offset voltages.

In this regard, FIG. 2 illustrates an exemplary process 200 employed by the automatically calibrating op-amp system 100 in FIG. 1 to compensate the op-amp 102 for the composite offset voltage ($V_{OFFSET}$). The process 200 includes generating the op-amp output voltage signal ($V_{OUT}$) of the op-amp 102 based on the voltage differential of the primary differential input pair 114(0), 114(1) and the voltage differential of the auxiliary differential input pair 112(0), 112(1) (block 202). The process 200 further includes electrically coupling the primary differential input pair 114(0), 114(1) in response to the mode signal (MODE) indicating the calibration mode (block 204). The process 200 also includes electrically decoupling the primary differential input pair 114(0), 114(1) in response to the mode signal (MODE) indicating the amplify mode (block 206). The analog calibration signal (CAL) has a voltage corresponding to a fraction of the reference voltage ($V_{REF}$). Further, the process 200 includes successively generating the bit signals 108(7)-108(0) in response to the mode signal (MODE) indicating the calibration mode (block 208). In this manner, the value of each successive of bit signal 108(7)-108(0) is based on the op-amp output voltage signal ($V_{OUT}$).

With continuing reference to FIG. 2, the process 200 also includes converting each successive bit signal 108(7)-108(0) into the analog calibration signal (CAL) based on the reference voltage ($V_{REF}$) in response to the mode signal (MODE) indicating the calibration mode (block 210). Further, the process 200 includes providing the analog calibration signal (CAL) to one auxiliary input 112(1) of the auxiliary differential input pair 112(0), 112(1) (block 212). Additionally, another auxiliary input 112(0) of the auxiliary differential input pair 112(0), 112(1) is driven by a voltage based on the reference voltage ($V_{REF}$) such that the analog calibration signal (CAL) compensates for the composite offset voltage ($V_{OFFSET}$) of the op-amp 102 in response to the mode signal (MODE) indicating the amplify mode. By employing the process 200, the automatically calibrating op-amp system 100 in FIG. 1 is able to generate the op-amp output voltage signal ($V_{OUT}$) such that the effects of the composite offset voltage ($V_{OFFSET}$) on the op-amp output voltage signal ($V_{OUT}$) are reduced or avoided.

In this regard, as a non-limiting example to more fully illustrate the operation described with reference to FIGS. 1 and 2, FIG. 3 illustrates an exemplary set 300 of bit signals 108(7)-108(0) and the analog calibration signal (CAL) generated in FIG. 1 when employing the process 200 in FIG. 2. In this example, the reference voltage ($V_{REF}$) is equal to one hundred millivolts (100 mV), and the composite offset voltage ($V_{OFFSET}$) is equal to forty millivolts (40 mV). With reference to FIGS. 1-3, during the first cycle of the calibration mode (Cycle 1), the SAR controller 106 is configured to set bit signal 108(7) (e.g., the most significant bit) to a logic high '1' state, and allows the bit signals 108(6)-108(0) to remain at a logic low '0' state, thus setting the bit signals 108(7)-108(0) to a binary number 10000000 (i.e., Arabic 128). The DAC 110 is configured to generate the analog calibration signal (CAL) using the equation CAL=((bit signals 108(7)-108(0))/$2^N$)*($V_{REF}$). In this example, N=8, and thus, the analog calibration signal (CAL)=((bit signals 108(7)-108(0))/$2^8$)*($V_{REF}$) or ((bit signals 108(7)-108(0))/256)*($V_{REF}$).

With continuing reference to FIGS. 1-3, during the first cycle of the calibration mode (Cycle 1), the DAC 110 generates the analog calibration signal (CAL) with a voltage equal to (128/256)*$V_{REF}$, or ½*$V_{REF}$. In this manner, the analog calibration signal (CAL) corresponding to the first cycle of the calibration mode (Cycle 1) is equal to ½*(100 mV), or 50 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$). If the composite offset voltage ($V_{OFFSET}$) is greater than the analog calibration signal (CAL), the op-amp output voltage signal ($V_{OUT}$) has a logic high '1' state. However, if the composite offset voltage ($V_{OFFSET}$) is less than the analog calibration signal (CAL), the op-amp output voltage signal ($V_{OUT}$) has a logic low '0' state. The composite offset voltage ($V_{OFFSET}$) is 40 mV, which is less than the 50 mV of the analog calibration signal (CAL). As a result, the bit signal 108(7) within the SAR controller 106 corresponding to the first cycle (Cycle 1) is set to the logic low '0' state of the op-amp output voltage signal ($V_{OUT}$).

With continuing reference to FIGS. 1-3, during the second cycle of the calibration mode (Cycle 2), the SAR controller 106 is configured to set bit signal 108(6) to a logic high '1' state and allows the bit signals 108(5)-108(0) to remain at a logic low '0' state, thus setting the bit signals 108(7)-108(0) to a binary number 01000000 (i.e., Arabic 64). During the second cycle of the calibration mode (Cycle 2), the analog calibration signal (CAL) is generated by the DAC 110 with a voltage equal to (64/256)*$V_{REF}$, or ¼*$V_{REF}$. Thus, the analog calibration signal (CAL) corresponding to the second cycle (Cycle 2) of the calibration mode is equal to ¼*(100 mV), or 25 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is greater than the 25 mV of the analog calibration signal (CAL), the op-amp output voltage signal ($V_{OUT}$) has a logic high '1' state. As a result, the bit signal 108(6) within the SAR controller 106 corresponding to the second cycle (Cycle 2) is set to the logic high '1' state of the op-amp output voltage signal ($V_{OUT}$).

With continuing reference to FIGS. 1-3, during the third cycle of the calibration mode (Cycle 3), the SAR controller 106 is configured to set bit signal 108(5) to a logic high '1' state and allows the bit signals 108(4)-108(0) to remain at a logic low '0' state, thus setting the bit signals 108(7)-108(0) to a binary number 01100000 (i.e., Arabic 96). During the third cycle of the calibration mode (Cycle 3), the analog calibration signal (CAL) is generated by the DAC 110 with a voltage equal to (96/256)*$V_{REF}$, or ⅜*$V_{REF}$. Thus, the analog calibration signal (CAL) corresponding to the third cycle (Cycle 3) of the calibration mode is equal to ⅜*(100 mV), or 37.5 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is greater than the 37.5 mV of the analog calibration signal (CAL), the op-amp output voltage signal ($V_{OUT}$) has a logic high '1' state. As a result, the bit signal 108(5) within the SAR controller 106 corresponding to the third cycle (Cycle 3) is set to the logic high '1' state of the op-amp output voltage signal ($V_{OUT}$).

With continuing reference to FIGS. 1-3, during the fourth cycle of the calibration mode (Cycle 4), the SAR controller 106 is configured to set bit signal 108(4) to a logic high '1' state and allows the bit signals 108(3)-108(0) to remain at a logic low '0' state, thus setting the bit signals 108(7)-108(0) to a binary number 01110000 (i.e., Arabic 112). During the fourth cycle of the calibration mode (Cycle 4), the analog calibration signal (CAL) is generated by the DAC 110 with a voltage equal to (112/256)*$V_{REF}$, or 7/16*$V_{REF}$. Thus, the analog calibration signal (CAL) corresponding to the fourth cycle (Cycle 4) of the calibration mode is equal to 7/16*(100 mV), or 43.75 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is less than the 43.75 mV of the analog calibration signal (CAL), the op-amp output voltage signal ($V_{OUT}$) has a logic low '0' state, causing the bit signal 108(4) within the SAR controller 106 to be set to the logic low '0' state of the op-amp output voltage signal ($V_{OUT}$).

With continuing reference to FIGS. 1-3, during the fifth cycle of the calibration mode (Cycle 5), the SAR controller 106 is configured to set bit signal 108(3) to a logic high '1' state and allows the bit signals 108(2)-108(0) to remain at a logic low '0' state, thus setting the bit signals 108(7)-108(0) to a binary number 01101000 (i.e., Arabic 104). During the fifth cycle of the calibration mode (Cycle 5), the analog calibration signal (CAL) is generated by the DAC 110 with a voltage equal to (104/256)*$V_{REF}$, or 13/32*$V_{REF}$. Thus, the analog calibration signal (CAL) corresponding to the fifth cycle (Cycle 5) of the calibration mode is equal to 13/32*(100 mV), or 40.63 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is less than the 40.63 mV of the analog calibration signal (CAL), the op-amp output voltage signal ($V_{OUT}$) has a logic low '0' state, causing the bit signal 108(3) within the SAR controller 106 to be set to the logic low '0' state of the op-amp output voltage signal ($V_{OUT}$).

With continuing reference to FIGS. 1-3, during the sixth cycle of the calibration mode (Cycle 6), the SAR controller 106 is configured to set bit signal 108(2) to a logic high '1' state and allows the bit signals 108(1)-108(0) to remain at a logic low '0' state, thus setting the bit signals 108(7)-108(0) to a binary number 01100100 (i.e., Arabic 100). During the sixth cycle of the calibration mode (Cycle 6), the analog calibration signal (CAL) is generated by the DAC 110 with a voltage equal to $(100/256)*V_{REF}$, or $25/64*V_{REF}$. Thus, the analog calibration signal (CAL) corresponding to the sixth cycle (Cycle 6) of the calibration mode is equal to 25/64*(100 mV), or 39.06 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is greater than the 39.06 mV of the analog calibration signal (CAL), the op-amp output voltage signal ($V_{OUT}$) has a logic high '1' state, causing the bit signal 108(2) within the SAR controller 106 to be set to the logic high '1' state of the op-amp output voltage signal ($V_{OUT}$).

With continuing reference to FIGS. 1-3, during the seventh cycle of the calibration mode (Cycle 7), the SAR controller 106 is configured to set bit signal 108(1) to a logic high '1' state and allows the bit signal 108(0) to remain at a logic low '0' state, thus setting the bit signals 108(7)-108(0) to a binary number 01100110 (i.e., Arabic 102). During the seventh cycle of the calibration mode (Cycle 7), the analog calibration signal (CAL) is generated by the DAC 110 with a voltage equal to $(102/256)*V_{REF}$, or $51/128*V_{REF}$. Thus, the analog calibration signal (CAL) corresponding to the seventh cycle (Cycle 7) of the calibration mode is equal to 51/128*(100 mV), or 39.84 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is greater than the 39.84 mV of the analog calibration signal (CAL), the op-amp output voltage signal ($V_{OUT}$) has a logic high '1' state, causing the bit signal 108(1) within the SAR controller 106 to be set to the logic high '1' state of the op-amp output voltage signal ($V_{OUT}$).

With continuing reference to FIGS. 1-3, during the eighth cycle of the calibration mode (Cycle 8), the SAR controller 106 is configured to set bit signal 108(0) to a logic high '1' state, thus setting the bit signals 108(7)-108(0) to a binary number 01100111 (i.e., Arabic 103). During the eighth cycle of the calibration mode (Cycle 8), the analog calibration signal (CAL) is generated by the DAC 110 with a voltage equal to $(103/256)*V_{REF}$. Thus, the analog calibration signal (CAL) corresponding to the eighth cycle (Cycle 8) of the calibration mode is equal to 103/256*(100 mV), or 40.23 mV. The analog calibration signal (CAL) is provided to the second auxiliary input 112(1) of the op-amp 102, and the op-amp 102 is configured to compare the analog calibration signal (CAL) to the composite offset voltage ($V_{OFFSET}$) again. In this example, because the composite offset voltage ($V_{OFFSET}$) of 40 mV is less than the 40.23 mV of the analog calibration signal (CAL), the op-amp output voltage signal ($V_{OUT}$) has a logic low '0' state, causing the bit signal 108(0) within the SAR controller 106 to be set to the logic low '0' state of the op-amp output voltage signal ($V_{OUT}$). Thus, the bit signal 108(7)-108(0) following the eighth cycle (Cycle 8) of the calibration mode is the binary number 01100110 (i.e., Arabic 102).

In this regard, the example in FIG. 3 illustrates that the analog calibration signal (CAL) generated by the DAC 110 in FIG. 1 (e.g., 39.84 mV) in response to the mode signal (MODE) indicating the calibration mode is approximately equal to the composite offset voltage ($V_{OFFSET}$). Thus, the analog calibration signal (CAL) can be provided to the second auxiliary input 112(1) such that the effects of the composite offset voltage ($V_{OFFSET}$) on the op-amp output voltage signal ($V_{OUT}$) are reduced or avoided in response to the mode signal (MODE) indicating the amplify mode. Further, during the ninth cycle (Cycle 9) (not shown) of the calibration mode in this example, the SAR controller 106 is configured to generate the done signal (DONE) that can notify other components that the calibration mode is complete.

Figure 4:
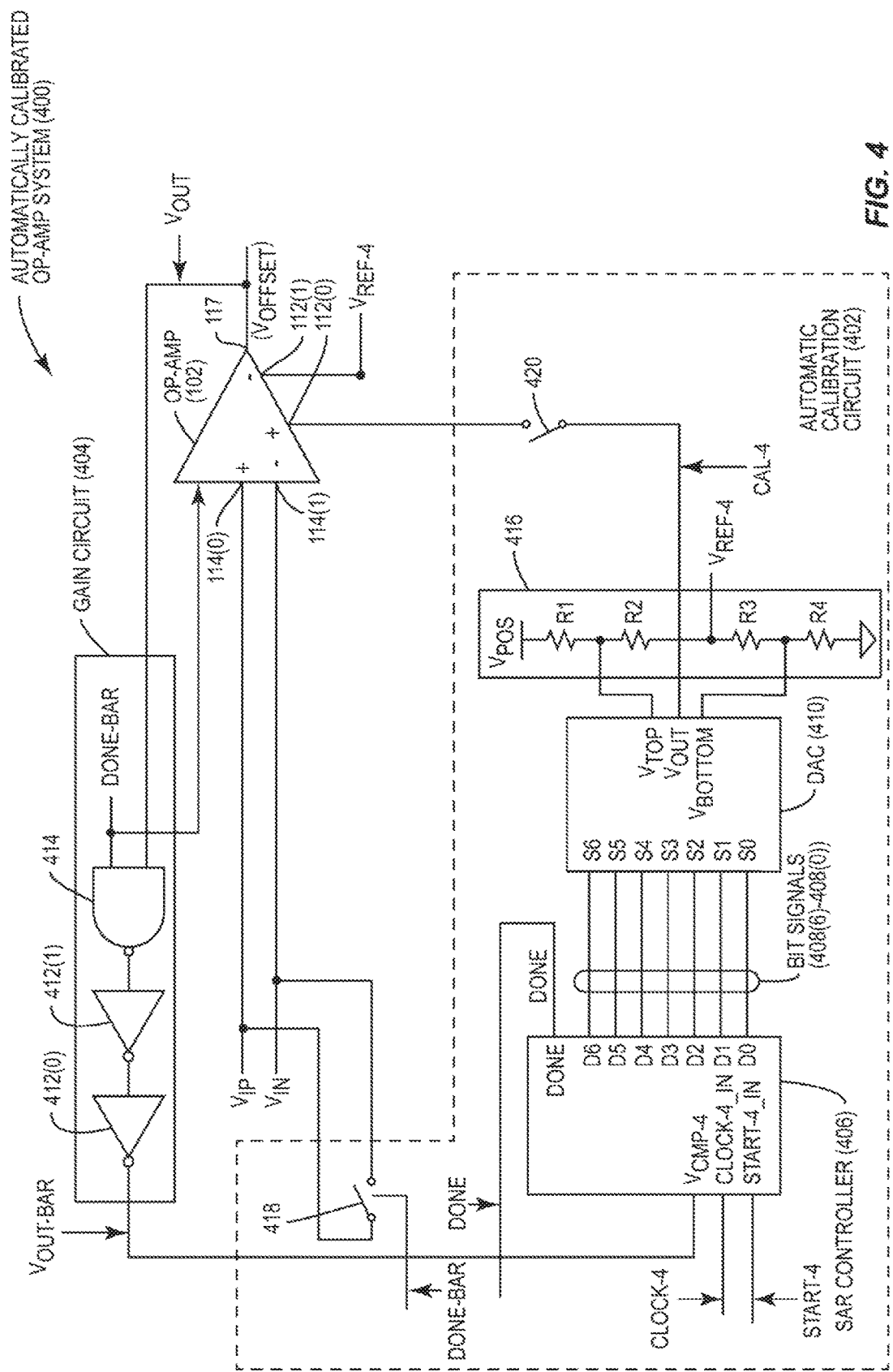
FIG. 4 is a diagram of another exemplary automatically calibrating op-amp system for mitigating effects of offset voltages that provides an analog calibration signal to a negative auxiliary input of an op-amp rather than a positive auxiliary input.

While the analog calibration signal (CAL) in the automatically calibrating op-amp system 100 in FIG. 1 is provided to the second auxiliary input 112(1) in the op-amp 102 (e.g., a negative input), other aspects may achieve similar compensation when providing the analog calibration signal to the first auxiliary input 112(0) (e.g., a positive input). In this regard, FIG. 4 illustrates an automatically calibrating op-amp system 400 employing the op-amp 102. However, as described in detail below, rather than providing the analog calibration signal (CAL) to the second auxiliary input 112(1) as in the automatically calibrating op-amp system 100, a calibration signal (CAL-4) in this aspect is provided to the first auxiliary input 112(0).

With continuing reference to FIG. 4, similar to the description provided above in relation to FIGS. 1-3, the automatically calibrating op-amp system 400 employs the op-amp 102 and an automatic calibration circuit 402, wherein the composite offset voltage ($V_{OFFSET}$) can be described with reference to the auxiliary differential input pair 112 (e.g., the composite offset voltage ($V_{OFFSET}$) is equal to $A*V_{OSAM}/B+V_{OSBM}$). The op-amp 102 is configured to generate the op-amp output voltage signal ($V_{OUT}$) based on the composite offset voltage ($V_{OFFSET}$) of the op-amp 102 and the analog calibration signal (CAL-4) in response to the mode signal (MODE) indicating the calibration mode. However, because the analog calibration signal (CAL-4) is provided to the first auxiliary input 112(0) (e.g., the positive input), the automatically calibrating op-amp system 400 also includes a gain circuit 404 configured to generate an inverted op-amp output voltage signal ($V_{OUT-BAR}$) with an inverse polarity of the op-amp output voltage signal ($V_{OUT}$). By inverting the polarity of the op-amp output voltage signal ($V_{OUT}$), the gain circuit 404 allows the analog calibration signal (CAL-4) to compensate for the effects of the composite offset voltage ($V_{OFFSET}$) while being provided to the first auxiliary input 112(0) (e.g., the positive input). The gain circuit 404 also provides gain to the inverted op-amp output voltage signal ($V_{OUT-BAR}$) such that a SAR controller 406 may use the inverted op-amp output voltage signal ($V_{OUT-BAR}$) received on an input $V_{CMP-4}$ to generate bit signals 408(6)-408(0) that are provided to a DAC 410. In this aspect, the gain circuit 404 includes inverters 412(0), 412(1), and an AND-based gate 414 (e.g., a NAND gate 414).

With continuing reference to FIG. 4, the SAR controller 406 is a seven-bit SAR controller configured to generate the bit signals 408(6)-408(0) based on the inverted op-amp output voltage signal ($V_{OUT-BAR}$). The DAC 410 is configured to generate the analog calibration signal (CAL-4) in response to each bit signal 408(6)-408(0). However, the structure of the DAC 410 differs from the DAC 110 in FIG. 1 in that the DAC 410 is configured to receive a top reference voltage ($V_{TOP}$) and a bottom reference voltage ($V_{BOTTOM}$), such that the analog calibration signal (CAL-4) generated by the DAC 410 has voltage between ($V_{TOP}$) and ($V_{BOTTOM}$). Thus, the DAC 410 is configured to generate the analog calibration signal (CAL-4) using the equation CAL-4=[(($V_{TOP}-V_{BOTTOM}$)/$2^N$)*(bit signals 408(6)-408(0))]+ $V_{BOTTOM}$. Further, a voltage divider 416 is employed that is driven by a positive voltage ($V_{POS}$) and includes resistors R1, R2, R3, and R4. The voltage divider 416 is configured to receive the top reference voltage ($V_{TOP}$) and the bottom reference voltage ($V_{BOTTOM}$) and generate the reference voltage ($V_{REF-4}$), which is a weighted average of the top reference voltage ($V_{TOP}$) and the bottom reference voltage ($V_{BOTTOM}$). In this manner, the reference voltage ($V_{REF-4}$) is calculated using the equation (R3*$V_{TOP}$+R2*$V_{BOTTOM}$)/(R2+R3). If R2 is equal to R3, then the reference voltage ($V_{REF-4}$) equals the average of the top reference voltage ($V_{TOP}$) and the bottom reference voltage ($V_{BOTTOM}$) (i.e., ($V_{TOP}+V_{BOTTOM}$)/2). The reference voltage ($V_{REF-4}$) drives the second auxiliary input 112(1) of the op-amp 102. In this manner, the voltage differential of the analog calibration signal (CAL-4) and the reference voltage ($V_{REF-4}$) may compensate for the composite offset voltage ($V_{OFFSET}$) between a range of positive and negative voltages.

With continuing reference to FIG. 4, the op-amp 102 is configured to use the analog calibration signal (CAL-4) to compensate the op-amp output voltage signal ($V_{OUT}$) generated by the op-amp 102 in response to the mode signal (MODE) indicating the amplify mode. The op-amp output voltage signal ($V_{OUT}$) is compensated to mitigate the effects of the composite offset voltage ($V_{OFFSET}$) similar to FIG. 1.

With continuing reference to FIG. 4, the operation of the automatically calibrating op-amp system 400 is similar to the operation described in FIG. 1. In this manner, a start signal (START-4) received on a start input (START-4_IN) notifies the SAR controller 406 of the calibration mode, which is controlled by a clock signal (CLOCK-4) received on a clock input (CLOCK-4_IN) similar to the calibration mode described in FIG. 1. Further, the SAR controller 406 is configured to generate a done signal (DONE) that can notify other components that the calibration mode is complete. An inverted done signal (DONE-BAR) is used to control a switch 418 configured to couple the first voltage input ($V_{IP}$) to the first and second primary inputs 114(0), 114(1) in response to the mode signal (MODE) indicating the calibration mode. The inverted done signal (DONE-BAR) is also used as an input to the AND-based gate 414 in the gain circuit 404. Further, when the inverted done signal (DONE-BAR) deactivates the switch 418, the automatically calibrating op-amp system 400 operates in the amplify mode, and the op-amp 102 generates the op-amp output voltage signal ($V_{OUT}$) in a manner in which the analog calibration signal (CAL-4) compensates for the effects of the composite offset voltage ($V_{OFFSET}$) of the op-amp 102. A switch 420 is also included that may be controlled to selectively provide the analog calibration signal (CAL-4) to the op-amp 102 in FIG. 3.

Figure 5:
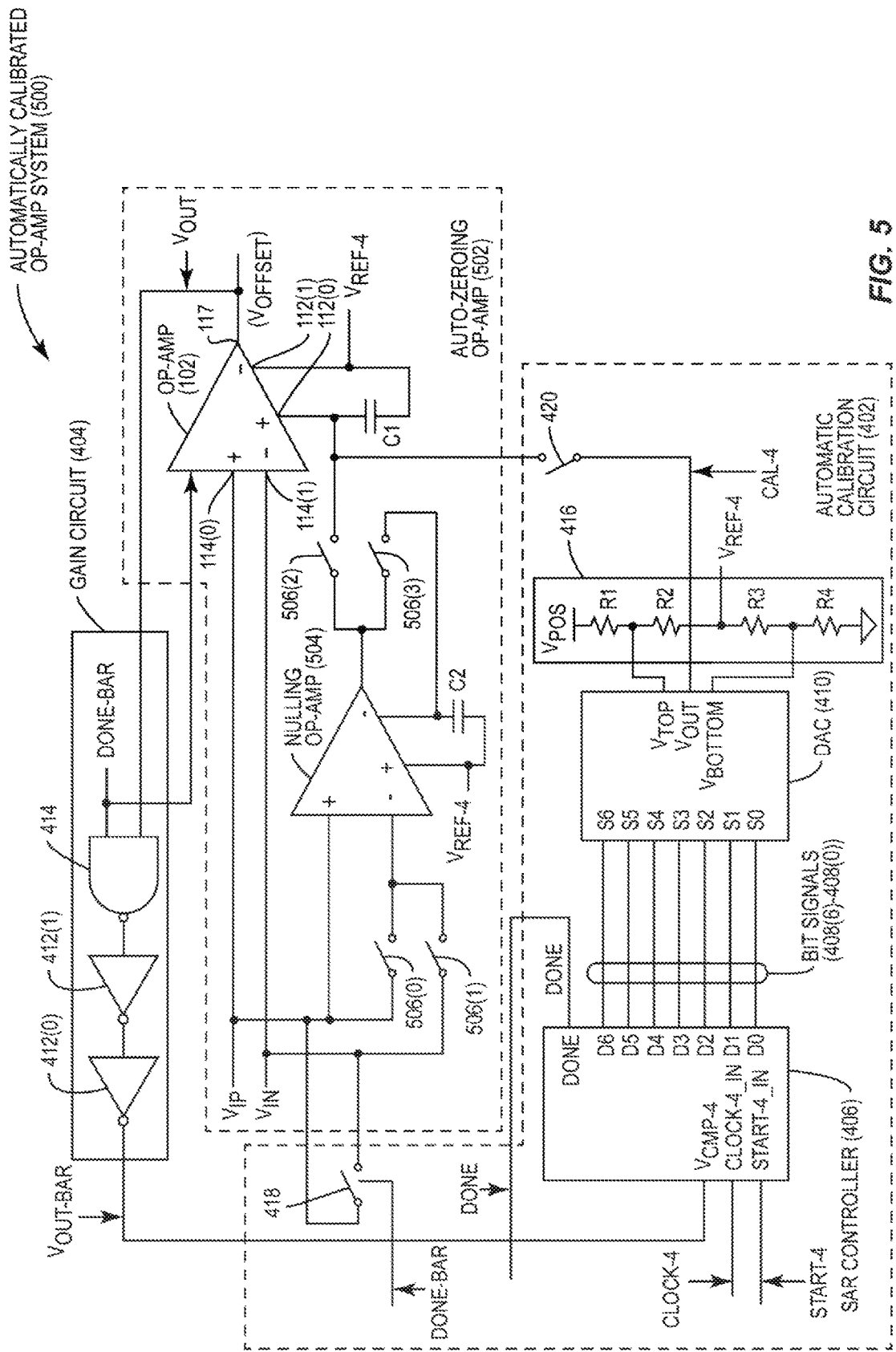
FIG. 5 is a diagram of another exemplary automatically calibrating op-amp system for mitigating effects of offset voltages employed in a circuit design that includes an auto-zeroing op-amp.

Additionally, FIG. 5 illustrates an automatically calibrating op-amp system 500 similar to the automatically calibrating op-amp system 400 in FIG. 4. Although the op-amp 102 is employed within an auto-zeroing op-amp 502 that includes a nulling op-amp 504, the automatically calibrating op-amp system 500 and the auto-zeroing mechanism of the auto-zeroing op-amp 502 are not used concurrently. In other words, the automatically calibrating op-amp system 500 compensates the op-amp output voltage signal ($V_{OUT}$) generated by the op-amp 102 to mitigate the effects of the composite offset voltage ($V_{OFFSET}$), and thus, the nulling op-amp 504 is not used to provide voltage compensation as in a conventional auto-zeroing op-amp. Instead, switches 506(0)-506(3) remain deactivated such that the nulling op-amp 504 does not provide any voltage to the first auxiliary input 112(0). In this manner, FIG. 5 illustrates that the automatically calibrating op-amp system 500 may be formed using the op-amp 102 in the auto-zeroing op-amp 502 while disabling the nulling op-amp 504. Thus, the elements of the automatically calibrating op-amp system 500, such as the SAR controller 406 and the DAC 410, may be added to a circuit design that includes the auto-zeroing op-amp 502 rather than only to circuits including the op-amp 102. Such a strategy may be used to achieve the automatic calibration of the op-amp 102 in the auto-zeroing op-amp 502 when it is desirable to avoid changing the internal components of the op-amp design.

Figure 6:
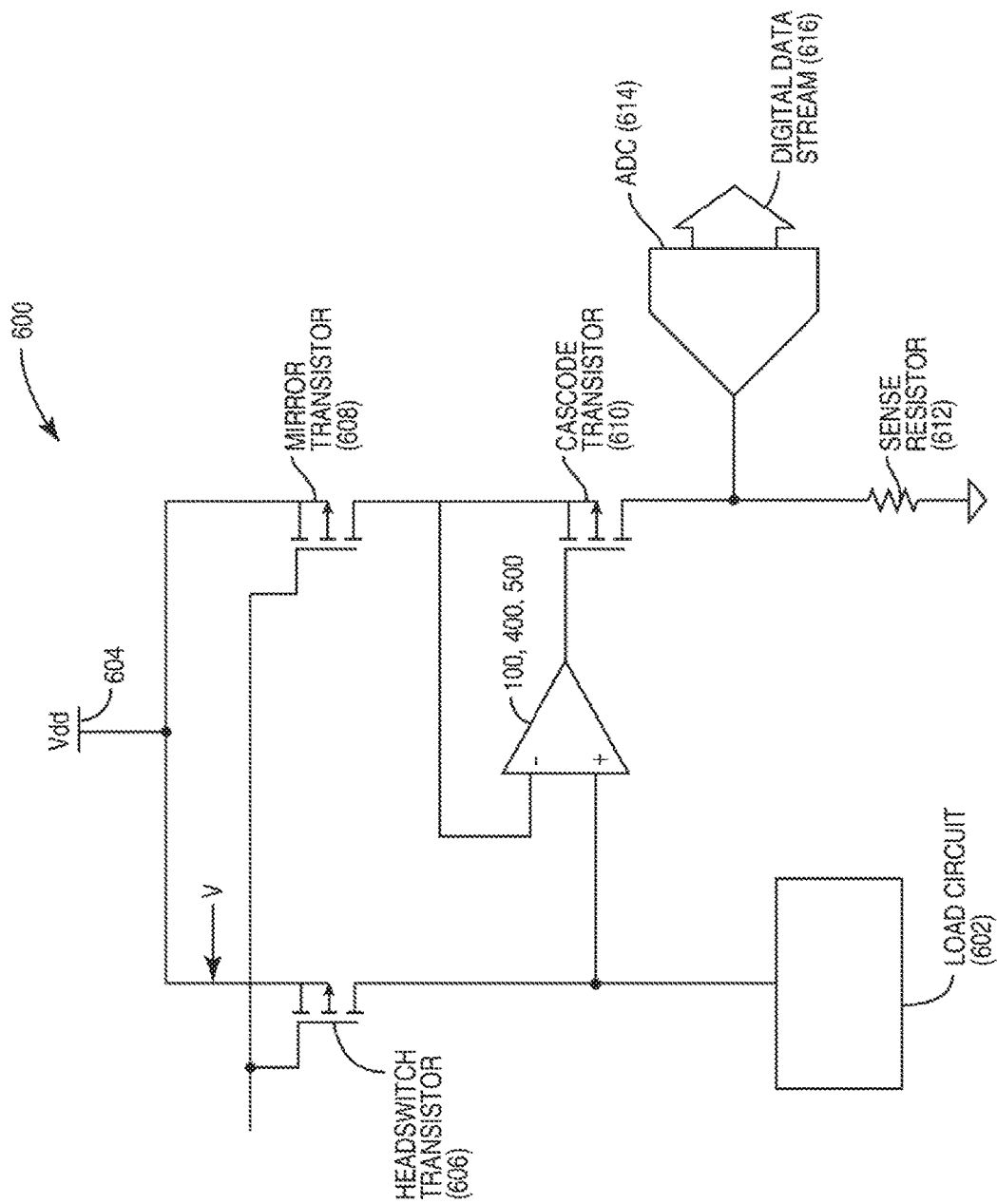
FIG. 6 is a diagram of an exemplary on-die current measurement system (ODCM) used to measure a power supply current of a load circuit, wherein the ODCM employs the automatically calibrating op-amp system in FIG. 1 to reduce the effects of offset voltages on the measured power supply current.

Further, one circuit that may use the automatically calibrating op-amp systems 100, 400, or 500 in FIG. 1, 4, or 5, respectively, is an on-die current measurement (ODCM) system 600 illustrated in FIG. 6. For clarity, elements related to the automatically calibrating op-amp system 100 in FIG. 1 will be referenced when describing this aspect. The ODCM system 600 is used to measure a power supply current (not shown) of a load circuit 602. To measure such a current, the ODCM system 600 includes a voltage source ($V_{dd}$) 604 that provides an input voltage to a source of a head switch transistor 606. The head switch transistor 606 provides power control to the load circuit 602 by allowing a voltage signal (V) to reach the load circuit 602. The voltage source 604 also provides an input voltage to a source of a mirror transistor 608, which is a fraction of the width of the head switch transistor 606. Both the head switch transistor 606 and the mirror transistor 608 are biased deep in the field effect transistor (FET) triode region, effectively making them function as low-value resistors. Further, a cascode transistor 610 controls a voltage across the mirror transistor 608, causing a current to flow through the cascode transistor 610 to a sense resistor 612. A voltage is generated across the sense resistor 612 such that an analog-to-digital converter (ADC) 614 can generate a digital data stream 616 that represents the power supply current of the load circuit 602.

With continuing reference to FIG. 6, in order for the ODCM system 600 to function properly, the head switch transistor 606 and the mirror transistor 608 need to have precisely equal drain-source voltages. In this manner, the automatically calibrating op-amp system 100 in FIG. 1, together with the cascode transistor 610, forces the drain-source voltage of the mirror transistor 608 to equal that of the head switch transistor 606. Notably, the op-amp 102 in the automatically calibrating op-amp system 100 is configured to receive a first input voltage (not shown) on the first primary input 114(0) from the mirror transistor 608, and a second input voltage (not shown) on the second primary input 114(1) from the load circuit 602. More specifically, the automatically calibrating op-amp system 100 controls the cascode transistor 610 in order to keep the voltage across the mirror transistor 608 equal to the voltage across the head switch transistor 606. Thus, the drain-source voltages of the mirror transistor 608 and the head switch transistor 606 are kept equal to one another. However, in this example, the head switch transistor 606 is relatively large compared to the mirror transistor 608, and thus, the drain-source voltage of the head switch transistor 606 is relatively small. Thus, if the effects of a composite offset voltage ($V_{OFFSET}$) associated with the op-amp 102 are negligible, then the automatically calibrating op-amp system 100 will not disturb the drain-source voltage of the mirror transistor 608. In this manner, the drain-source voltage of the mirror transistor 608 will be precisely equal to that of the head switch transistor 606, because the automatically calibrating op-amp system 100 is configured to compensate (i.e., negate) the effects of the composite offset voltage ($V_{OFFSET}$).

Further, the elements described herein are sometimes referred to as means for performing particular functions. In this regard, the op-amp 102 is sometimes referred to herein as a means for generating the op-amp output voltage signal ($V_{OUT}$) based on the voltage differential of the primary differential input pair 114(0), 114(1) and the voltage differential of the auxiliary differential input pair 112(0), 112(1). The automatic calibration circuit 104 is sometimes referred to herein as a means for electrically coupling the primary differential input pair 114(0), 114(1) in response to the mode signal (MODE) indicating the calibration mode. The automatic calibration circuit 104 is also sometimes referred to herein as a means for electrically decoupling the primary differential input pair 114(0), 114(1) in response to the mode signal (MODE) indicating the amplify mode. The SAR controller 106 is sometimes referred to herein as a means for successively generating the plurality of bit signals 108(7)-108(0) in response to the mode signal (MODE) indicating the calibration mode. The DAC 110 is sometimes referred to herein as a means for converting each successive plurality of bit signals 108(7)-108(0) into the analog calibration signal (CAL) based on a reference voltage ($V_{REF}$) in response to the mode signal (MODE) indicating the calibration mode. Further, the DAC 110 is also sometimes referred to herein as a means for providing the analog calibration signal (CAL) to one auxiliary input 112(1) of the auxiliary differential input pair 112(0), 112(1).

The automatically calibrating operational amplifier (op-amp) systems for mitigating effects of offset voltages according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
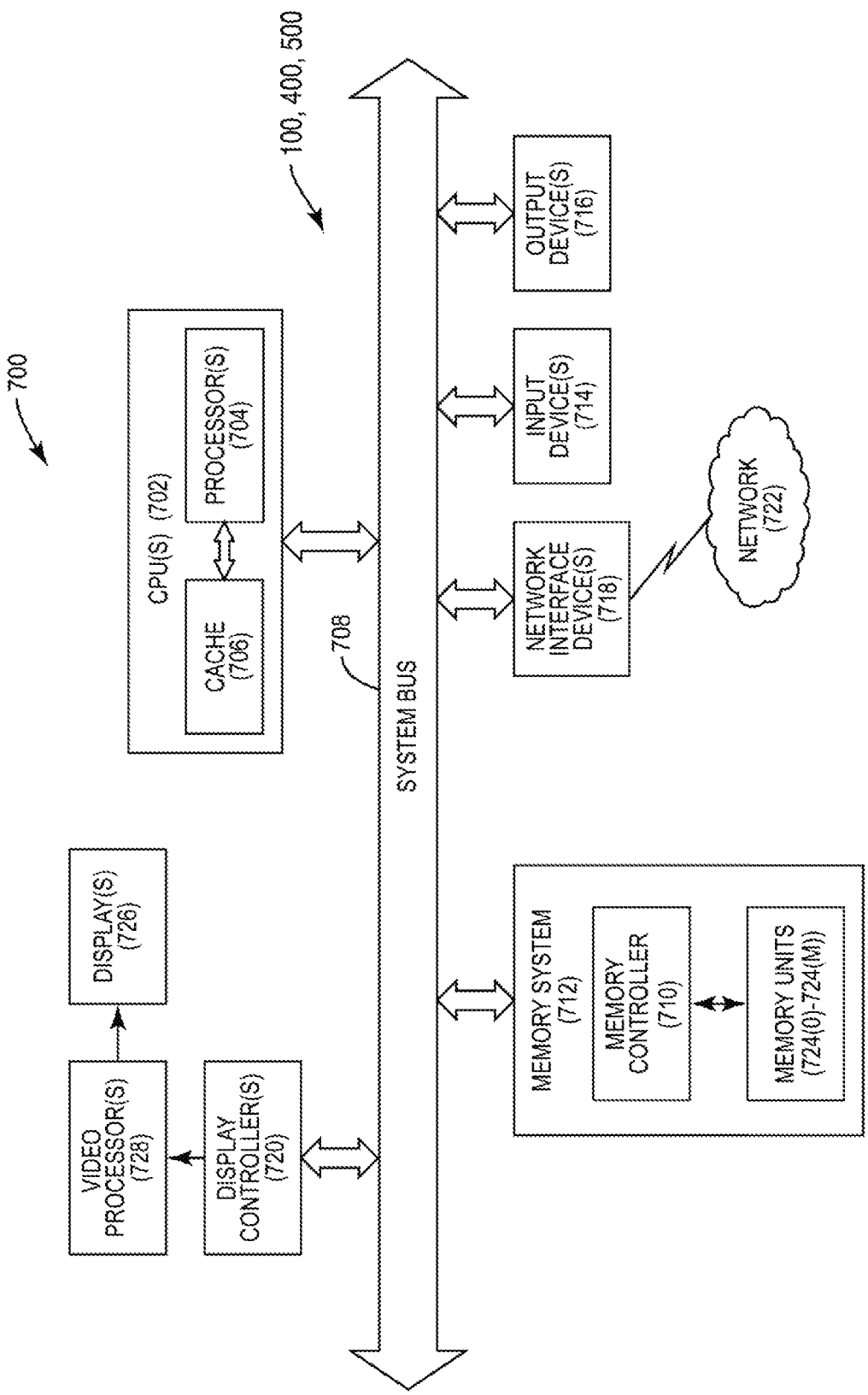
FIG. 7 is a block diagram of an exemplary processor-based system that can include the exemplary automatically calibrating op-amp systems disclosed herein, including without limitation the automatically calibrating op-amp systems in FIGS. 1, 4, and 5, for mitigating effects of offset voltages.

In this regard, FIG. 7 illustrates an example of a processor-based system 700 that includes elements that can employ the automatically calibrating op-amp systems 100, 400, or 500 illustrated in FIGS. 1, 4, and 5, respectively. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any device configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0)-724(M).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An automatically calibrating operational amplifier (op-amp) system, comprising:
an op-amp, comprising:
a primary differential input pair, an auxiliary differential input pair, and an output;
the op-amp configured to generate an op-amp output voltage signal on the output based on a voltage differential of the primary differential input pair and a voltage differential of the auxiliary differential input pair; and
an automatic calibration circuit configured to:
electrically couple the primary differential input pair in response to a mode signal indicating a calibration mode; and
electrically decouple the primary differential input pair in response to the mode signal indicating an amplify mode;
the automatic calibration circuit comprising:
a successive approximation register (SAR) controller configured to successively generate a plurality of bit signals in response to the mode signal indicating the calibration mode, wherein a value of each successive plurality of bit signals is based on the op-amp output voltage signal; and
a digital-to-analog converter (DAC), configured to:
convert each successive plurality of bit signals into an analog calibration signal based on a reference voltage in response to the mode signal indicating the calibration mode; and
provide the analog calibration signal to one auxiliary input of the auxiliary differential input pair, wherein another input of the auxiliary differential input pair is configured to be driven by a voltage based on the reference voltage such that the analog calibration signal compensates for a composite offset voltage of the op-amp in response to the mode signal indicating the amplify mode.

2. The automatically calibrating op-amp system of claim 1, wherein the SAR controller comprises:
a voltage compare input configured to receive the op-amp output voltage signal; and
a plurality of bit signal outputs configured to provide the successive plurality of bit signals to the DAC.

3. The automatically calibrating op-amp system of claim 2, wherein the DAC comprises:
a plurality of bit signal inputs configured to receive the successive plurality of bit signals; and
a calibration output configured to provide the analog calibration signal to one auxiliary input of the auxiliary differential input pair.

4. The automatically calibrating op-amp system of claim 3, wherein:
the primary differential input pair comprises a first primary input and a second primary input, wherein a primary offset voltage is associated with the first and second primary inputs; and
the auxiliary differential input pair comprises a first auxiliary input and a second auxiliary input, wherein an auxiliary offset voltage is associated with the first and second auxiliary inputs;
the composite offset voltage is based on the primary and auxiliary offset voltages.

5. The automatically calibrating op-amp system of claim 4, wherein the DAC is configured to provide the analog calibration signal by being configured to provide the analog calibration signal to the second auxiliary input of the op-amp.

6. The automatically calibrating op-amp system of claim 5, wherein the automatic calibration circuit further comprises:
a first switch configured to activate in response to the mode signal indicating the amplify mode, wherein:

a first input voltage is provided to the first primary input in response to activation of the first switch, wherein the automatically calibrating op-amp system is in the amplify mode; and the primary offset voltage is provided to the first primary input in response to deactivation of the first switch, wherein the automatically calibrating op-amp system is in the calibration mode; and a second switch configured to activate in response to the mode signal indicating the calibration mode, wherein:

the primary offset voltage is provided to the second primary input in response to activation of the second switch, wherein the automatically calibrating op-amp system is in the calibration mode; and a second input voltage is provided to the second primary input in response to deactivation of the second switch, wherein the automatically calibrating op-amp system is in the amplify mode.

7. The automatically calibrating op-amp system of claim 6, wherein the SAR controller further comprises:

a start input configured to receive a start signal; and
a clock input configured to receive a clock signal;
the SAR controller further configured to successively generate the plurality of bit signals by being configured to:
generate the plurality of bit signals in response to the start signal; and
generate the plurality of bit signals such that one bit signal is generated in a cycle of the clock signal.

8. The automatically calibrating op-amp system of claim 7, wherein the SAR controller comprises an eight-bit SAR controller.

9. The automatically calibrating op-amp system of claim 4, further comprising a gain circuit configured to generate an inverted op-amp output voltage signal, wherein the inverted op-amp output voltage signal is provided to the voltage compare input.

10. The automatically calibrating op-amp system of claim 9, wherein the DAC is further configured to:
receive a top reference voltage;
receive a bottom reference voltage; and
generate the analog calibration signal by being configured to generate the analog calibration signal with a voltage between the top reference voltage and the bottom reference voltage.

11. The automatically calibrating op-amp system of claim 10, wherein the DAC is configured to provide the analog calibration signal by being configured to provide the analog calibration signal to the first auxiliary input of the op-amp.

12. The automatically calibrating op-amp system of claim 11, wherein the SAR controller comprises a seven-bit SAR controller.

13. The automatically calibrating op-amp system of claim 1 integrated into an integrated circuit (IC).

14. The automatically calibrating op-amp system of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

15. An automatically calibrating operational amplifier (op-amp) system, comprising:

a means for generating an op-amp output voltage signal based on a voltage differential of a primary differential input pair and a voltage differential of an auxiliary differential input pair;

a means for electrically coupling the primary differential input pair in response to a mode signal indicating a calibration mode;

a means for electrically decoupling the primary differential input pair in response to the mode signal indicating an amplify mode;

a means for successively generating a plurality of bit signals in response to the mode signal indicating the calibration mode, wherein a value of each successive plurality of bit signals is based on the op-amp output voltage signal;

a means for converting each successive plurality of bit signals into an analog calibration signal based on a reference voltage in response to the mode signal indicating the calibration mode; and a means for providing the analog calibration signal to one auxiliary input of the auxiliary differential input pair, wherein another input of the auxiliary differential input pair is configured to be driven by a voltage based on the reference voltage such that the analog calibration signal compensates for a composite offset voltage of the means for generating the op-amp output voltage signal in response to the mode signal indicating the amplify mode.

16. A method for automatically calibrating an operational amplifier (op-amp), comprising:

generating an op-amp output voltage signal of an op-amp based on a voltage differential of a primary differential input pair and a voltage differential of an auxiliary differential input pair;

electrically coupling the primary differential input pair in response to a mode signal indicating a calibration mode;

electrically decoupling the primary differential input pair in response to the mode signal indicating an amplify mode;

successively generating a plurality of bit signals in response to the mode signal indicating the calibration mode, wherein a value of each successive plurality of bit signals is based on the op-amp output voltage signal;

converting each successive plurality of bit signals into an analog calibration signal based on a reference voltage in response to the mode signal indicating the calibration mode; and providing the analog calibration signal to one auxiliary input of the auxiliary differential input pair to be driven by a voltage based on the reference voltage such that the analog calibration signal compensates for a composite offset voltage of the op-amp in response to the mode signal indicating the amplify mode.

17. The method of claim 16, wherein successively generating the plurality of bit signals further comprises:
generating the plurality of bit signals in response to a start signal; and
generating the plurality of bit signals such that one bit signal is generated in a cycle of a clock signal.

18. The method of claim 16, wherein converting each successive plurality of bit signals into the analog calibration signal comprises:

receiving a top reference voltage;
receiving a bottom reference voltage; and
generating the analog calibration signal with a voltage between the top reference voltage and the bottom reference voltage.

19. An on-die current measurement system, comprising:
a voltage source configured to:
provide voltage to a source of a head switch transistor; and
provide voltage to a source of a mirror transistor;
the head switch transistor configured to provide voltage to a load circuit;
the mirror transistor configured to provide voltage to a source of a cascode transistor;
a drain of the cascode transistor configured to provide voltage to a sense resistor;
the sense resistor configured to provide voltage to an analog-to-digital converter (ADC);
the ADC configured to convert the voltage from the sense resistor into a digital data stream representative of a power supply current of the load circuit; and
an automatically calibrating operational amplifier (op-amp) system, comprising:
an op-amp, comprising:
a primary differential input pair, an auxiliary differential input pair, and an output;
the op-amp configured to generate an op-amp output voltage signal on the output based on a voltage differential of the primary differential input pair and a voltage differential of the auxiliary differential input pair; and
an automatic calibration circuit configured to:
electrically couple the primary differential input pair in response to a mode signal indicating a calibration mode; and
electrically decouple the primary differential input pair in response to the mode signal indicating an amplify mode;
the automatic calibration circuit comprising:
a successive approximation register (SAR) controller configured to successively generate a plurality of bit signals in response to the mode signal indicating the calibration mode, wherein a value of each successive plurality of bit signals is based on the op-amp output voltage signal; and
a digital-to-analog converter (DAC), configured to:
convert each successive plurality of bit signals into an analog calibration signal based on a reference voltage in response to the mode signal indicating the calibration mode; and
provide the analog calibration signal to one auxiliary input of the auxiliary differential input pair, wherein another input of the auxiliary differential input pair is configured to be driven by a voltage based on the reference voltage such that the analog calibration signal compensates for a composite offset voltage of the op-amp in response to the mode signal indicating the amplify mode;
the op-amp further configured to:
receive a first input voltage from a drain of the mirror transistor and a second input voltage from the load circuit in response to the mode signal indicating the amplify mode and provide the op-amp output voltage signal to a gate of the cascode transistor.

20. The on-die current measurement system of claim 19, wherein the SAR controller comprises:
a voltage compare input configured to receive the op-amp output voltage signal; and
a plurality of bit signal outputs configured to provide the successive plurality of bit signals to the DAC.

21. The on-die current measurement system of claim 20, wherein the DAC comprises:
a plurality of bit signal inputs configured to receive the successive plurality of bit signals; and
a calibration output configured to provide the analog calibration signal to one auxiliary input of the auxiliary differential input pair.

22. The on-die current measurement system of claim 21, wherein:
the primary differential input pair comprises a first primary input and a second primary input, wherein a primary offset voltage is associated with the first and second primary inputs; and
the auxiliary differential input pair comprises a first auxiliary input and a second auxiliary input, wherein an auxiliary offset voltage is associated with the first and second auxiliary inputs;
the composite offset voltage is based on the primary and auxiliary offset voltages.

23. The on-die current measurement system of claim 22, wherein the DAC is configured to provide the analog calibration signal by being configured to provide the analog calibration signal to the second auxiliary input of the op-amp.

24. The on-die current measurement system of claim 23, wherein the automatic calibration circuit further comprises:
a first switch configured to activate in response to the mode signal indicating the amplify mode, wherein:
the first input voltage is provided to the first primary input in response to activation of the first switch, wherein the automatically calibrating op-amp system is in the amplify mode; and
the primary offset voltage is provided to the first primary input in response to deactivation of the first switch, wherein the automatically calibrating op-amp system is in the calibration mode; and
a second switch configured to activate in response to the mode signal indicating the calibration mode, wherein:
the primary offset voltage is provided to the second primary input in response to activation of the second switch, wherein the automatically calibrating op-amp system is in the calibration mode; and
the second input voltage is provided to the second primary input in response to deactivation of the second switch, wherein the automatically calibrating op-amp system is in the amplify mode.

25. The on-die current measurement system of claim 24, wherein the SAR controller further comprises:
a start input configured to receive a start signal; and
a clock input configured to receive a clock signal;
the SAR controller further configured to successively generate the plurality of bit signals by being configured to:
generate the plurality of bit signals in response to the start signal; and
generate the plurality of bit signals such that one bit signal is generated in a cycle of the clock signal.

26. The on-die current measurement system of claim 25, wherein the SAR controller comprises an eight-bit SAR controller.

27. The on-die current measurement system of claim 22, further comprising a gain circuit configured to generate an inverted op-amp output voltage signal, wherein the inverted op-amp output voltage signal is provided to the voltage compare input.

28. The on-die current measurement system of claim 27, wherein the DAC is further configured to:
   receive a top reference voltage;
   receive a bottom reference voltage; and
   generate the analog calibration signal by being configured to generate the analog calibration signal with a voltage between the top reference voltage and the bottom reference voltage.

29. The on-die current measurement system of claim 28, wherein the DAC is configured to provide the analog calibration signal by being configured to provide the analog calibration signal to the first auxiliary input of the op-amp.

30. The on-die current measurement system of claim 29, wherein the SAR controller comprises a seven-bit SAR controller.

* * * * *